United States Patent
Kang et al.

(10) Patent No.: US 10,600,994 B2
(45) Date of Patent: Mar. 24, 2020

(54) ORGANIC LIGHT-EMITTING DISPLAY DEVICE

(71) Applicant: LG Display Co., Ltd., Seoul (KR)

(72) Inventors: JinGoo Kang, Seoul (KR); Young Hoon Shin, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/361,341

(22) Filed: Nov. 25, 2016

(65) Prior Publication Data

US 2017/0155086 A1    Jun. 1, 2017

(30) Foreign Application Priority Data

Nov. 27, 2015  (KR) .................. 10-2015-0167803

(51) Int. Cl.
```
H01L 51/52       (2006.01)
H01L 27/32       (2006.01)
H01L 27/12       (2006.01)
H01L 29/786      (2006.01)
```

(52) U.S. Cl.
CPC ...... H01L 51/5253 (2013.01); H01L 27/3262 (2013.01); H01L 51/524 (2013.01); H01L 51/5246 (2013.01); H01L 27/1225 (2013.01); H01L 27/3244 (2013.01); H01L 29/7869 (2013.01); H01L 29/78606 (2013.01); H01L 51/5237 (2013.01); H01L 51/5259 (2013.01)

(58) Field of Classification Search
None
See application file for complete search history.

(56) References Cited

U.S. PATENT DOCUMENTS

| | | | |
|---|---|---|---|
| 8,889,567 B2* | 11/2014 | Peng | ............... C23C 16/401 438/786 |
| 9,461,270 B2* | 10/2016 | Kang | ............ H01L 51/5253 |
| 2011/0133636 A1* | 6/2011 | Matsuo | ........... H01L 27/3211 313/504 |
| 2013/0072031 A1* | 3/2013 | Peng | ............... C23C 16/401 438/786 |
| 2015/0069376 A1 | 3/2015 | Son et al. | |
| 2015/0147833 A1* | 5/2015 | Kang | ............ H01L 51/5253 438/26 |

FOREIGN PATENT DOCUMENTS

| | | |
|---|---|---|
| CN | 104640958 | 5/2015 |
| CN | 104718219 | 6/2015 |
| EP | 2876701 A1 | 5/2015 |

OTHER PUBLICATIONS

European Search Report for European Patent Application No. EP 16198400, Apr. 28, 2017, 8 Pages.
Office Action for Chinese Patent Application No. CN 201611020621.1, dated Feb. 1, 2018, 21 Pages, (With English Translation).

* cited by examiner

*Primary Examiner* — Telly D Green
(74) *Attorney, Agent, or Firm* — Fenwick & West LLP

(57) ABSTRACT

Disclosed herein is an organic light-emitting display (OLED) device. The OLED device includes a pixel drive circuit and an organic light-emitting element on an array substrate, a passivation layer covering the pixel drive circuit and the organic light-emitting element so as to block permeation of moisture, and an adhesive layer on the passivation layer. The passivation layer is an inorganic thin film including an organosilicon compound.

18 Claims, 5 Drawing Sheets

ORGANIC LIGHT-EMITTING DISPLAY DEVICE

CROSS-REFERENCE TO RELATED APPLICATIONS

This application claims the priority of Republic of Korea Patent Application No. 10-2015-0167803 filed on Nov. 27, 2015, in the Korean Intellectual Property Office, the disclosure of which is incorporated herein by reference in its entirety.

BACKGROUND

Technical Field

The present disclosure relates to an organic light-emitting display (OLED) device and an encapsulation structure.

Description of the Related Art

Display devices provide a variety of information graphically on a screen and are the core technology of information communications. Such display devices are becoming thinner, lighter, and easier to carry, along with higher performance. With such a trend, organic light-emitting display (OLED) devices are attracting attention, which control the amount of light emitted from an organic emission layer to display images.

An OLED device is a self-luminous device using a thin emission layer between electrodes, and thus the overall device can be made thinner. Further, an OLED device is not only advantageous in terms of power consumption by low driving voltage, but also has excellent color implementation, response speed, viewing angle, and contrast ratio (CR).

In a typical OLED device, a pixel drive circuit and an organic light-emitting element are formed on a substrate, and light emitted from an organic light-emitting element may pass the substrate or a barrier layer, thereby displaying images. The organic light-emitting element can easily deteriorate by internal factors such as deterioration of the electrodes and the emission layer due to oxygen or moisture, deterioration by the reaction between the emission layer and interface, etc., as well as external factors such as moisture, oxygen, ultraviolet rays, and processing limitations of the device. Among these, oxygen and moisture seriously affect the lifespan of the OLED device, and thus encapsulation of the OLED device is very important.

As one of the encapsulation techniques, there is a known method of sealing the space above an organic light-emitting element with a passivation layer, or providing a face seal, or employing an encapsulation plate. The face seal contains moisture absorbent material to absorb moisture permeating into the organic light-emitting element. The face seal is applied on the inner surface of the encapsulation plate, and then the encapsulation plate is attached to a pixel array substrate. After the face seal sandwiched between the two substrates attached together (the encapsulation plate and the pixel array substrate) has been cured, pressure exerted against the substrates is removed, such that an OLED device having the face seal structure is fabricated. The encapsulation plate may be made of glass, plastic, metal, or the like.

SUMMARY

In view of the above, an object of the present disclosure is to provide an OLED device and an improved encapsulation structure used therein. Another object of the present disclosure is to provide an organic element passivation layer with improved reliability.

According to an aspect of the present disclosure, there is provided an OLED device including a pixel drive circuit and organic light-emitting element on an array substrate, a passivation layer covering the pixel drive circuit and the organic light-emitting element so as to block permeation of moisture, and an adhesive layer on the passivation layer. The passivation layer is an inorganic thin film including an organosilicon compound.

According to an exemplary embodiment of the present disclosure, change in characteristics of a thin film transistor (TFT) due to hydrogen permeation can be reduced.

According to another exemplary embodiment of the present disclosure, bright spots are reduced, such that the reliability of an OLED device can be improved.

BRIEF DESCRIPTION OF THE DRAWINGS

The above and other aspects, features and other advantages of the present disclosure will be more clearly understood from the following detailed description taken in conjunction with the accompanying drawings.

DETAILED DESCRIPTION OF THE EMBODIMENTS

Figure 1:
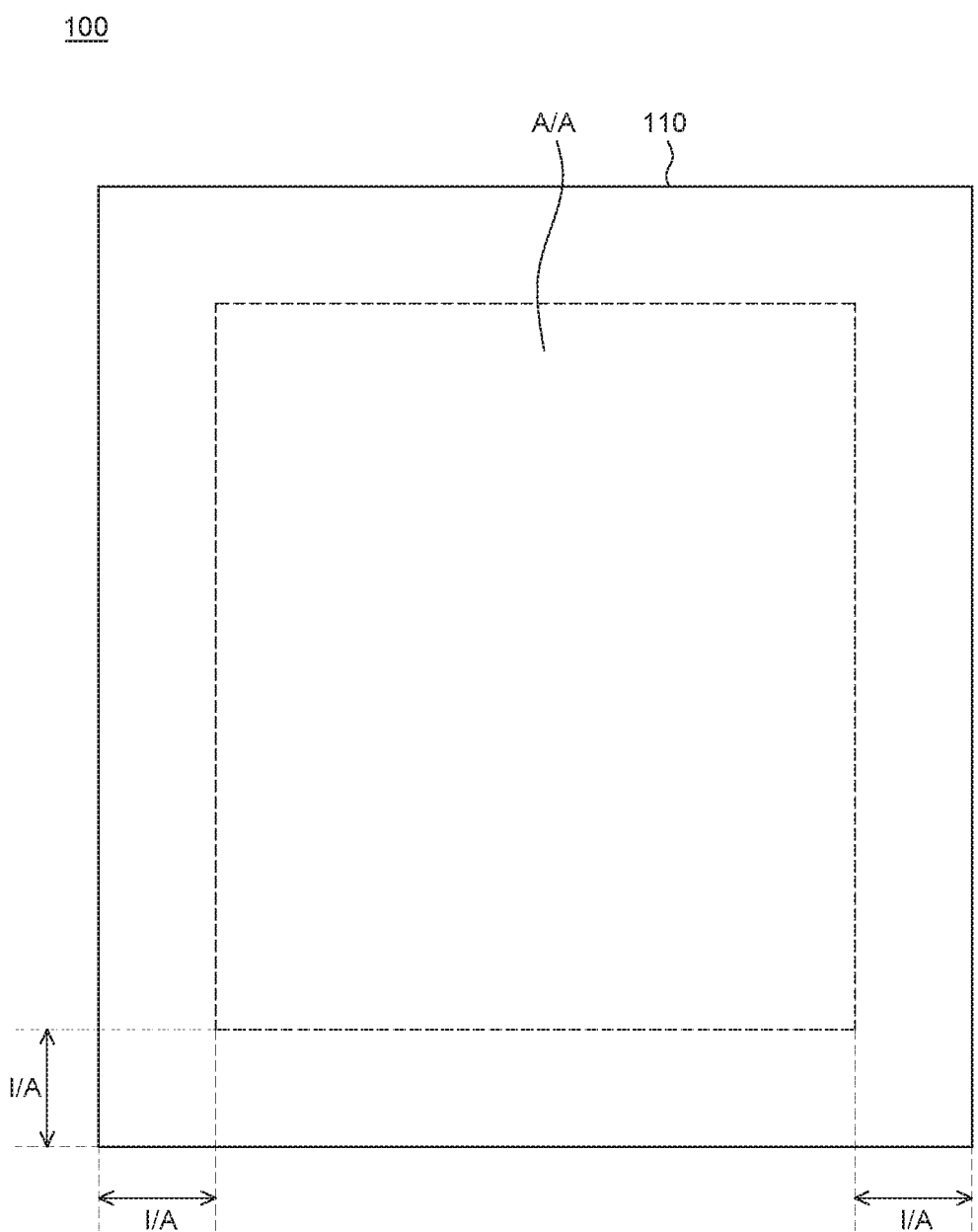
FIG. 1 is a plan view of an OLED device according to an exemplary embodiment of the present disclosure.

In describing some components of exemplary embodiments of the present disclosure, terms such as first, second, A, B, (a), (b), etc., may be used. These terms are used only to differentiate a component from another component. Therefore, the nature, sequence, order, number, etc., of the components are not limited by these terms. As used herein, phrases "an element A connected to an element B" or "an element A coupled with an element B" refer to that the element A may be directly connected to/coupled with the element B, that that another element C may be interposed between the element A and the element B, and/or that the element A may be indirectly connected to/coupled with the element B via another element C. As used herein, a phrase "an element A on an element B" refers to that the element A may be disposed directly on the element B and/or the element A may be disposed indirectly on the element B via another element C. The drawings are not to scale and the relative dimensions of various elements in the drawings are depicted schematically and not necessarily to scale.

As used herein, the term "OLED device" or "display device" collectively refers to an organic light-emitting diode panel and a display device employing such an organic light-emitting diode panel. Typically, OLED devices may be divided into white organic light-emitting display devices and RGB organic light-emitting display devices. In a white organic light-emitting device, sub-pixels in each of pixels emits white light, and a set of color filters is used in each of the sub-pixels to filter white light to produce red light, green light or blue light. In addition, a white organic light-emitting device may include sub-pixels with no color filter for forming sub-pixels for producing white light. On the other hand, in a RGB organic light-emitting device, an organic emission layer is configured to emit light of a particular color in each of sub-pixels. For example, a single pixel includes a red sub-pixel having an organic emission layer for emitting red light, a green sub-pixel having an organic emission layer for emitting green light, and a blue sub-pixel having an organic emission layer for emitting blue light.

Features of various exemplary embodiments of the present disclosure may be combined partially or totally. As will be clearly appreciated by those skilled in the art, technically various interactions and operations are possible. Various exemplary embodiments can be practiced individually or in combination. Hereinafter, exemplary embodiments of the present disclosure will be described in detail with reference to the accompanying drawings.

FIG. 1 is a plan view of an OLED device 100 according to an exemplary embodiment of the present disclosure.

Referring to FIG. 1, an OLED device 100 includes at least one active area A/A, in which an array of pixels is disposed. One or more inactive areas I/A may be disposed around the active area. That is, the inactive areas may be adjacent to one or more sides of the active area A/A. In FIG. 1, the inactive areas I/A surround a rectangular active area A/A. However, the shape of the active area A/A and the shape/layout of the inactive areas I/A adjacent to the active area A/A are not limited to those shown in FIG. 1. The active area A/A and the inactive areas I/A may have shapes appropriate for the design of an electronic device employing the OLED device 100. For example, the active area A/A may have a pentagon shape, a hexagon shape, a circle shape, an ellipse shape, etc.

Each of the pixels in the active area A/A may be electrically connected to corresponding pixel drive circuits. Each of the pixel drive circuits may include at least one switching transistor and at least one driving transistor. Each of the pixel drive circuits may be electrically connected to gate lines and data lines so as to transfer signals with a gate driver, a data driver, etc., disposed in the inactive area I/A.

The gate driver and the data driver may be implemented with TFTs in the inactive area I/A. The drivers may be referred to GIP circuits (gate-in-panel) circuits. In addition, some components such as a data driver IC (integrated circuit) may be mounted on a separated PCB (printed circuit board) and may be coupled with a connection interface (a pad, a bump, a pin, etc.) disposed in the inactive area I/A via a circuit film such as a FPCB (flexible printed circuit board), a COF (chip-on-film), a TCP (tape-carrier-package), etc. The printed circuits (COF, PCB, etc.) may be disposed behind the display device 100 upon being folded over to a rear thereof.

The OLED device 100 may include a variety of additional elements for generating various signals or voltages for driving the pixels in the active area A/A. The additional elements for driving the pixels may include an inverter circuit, a multiplexer, an electrostatic discharge circuit, etc. The OLED device 100 may include elements associated with features other than driving the pixels. For example, the OLED device 100 may include additional elements for providing a touch sense feature, a user authentication feature (e.g., fingerprint recognition), a multi-level pressure sense feature, a tactile feedback feature, etc. At least some of the above-mentioned additional elements may be disposed in the inactive areas I/A and/or an external circuit connected to the connection interface.

The OLED device 100 according to the exemplary embodiment of the present disclosure may include a TFT and an organic light-emitting element on an array substrate 110, an encapsulation layer on the organic light-emitting element, a barrier film attaching the substrate to the encapsulation layer, and the like. The term array substrate 110 may also refer to the substrate itself as well as elements and functional layers formed thereon, e.g., a switching TFT, a driving TFT connected to the switching TFT, an organic light-emitting element connected to the driving TFT, a protective film, etc.

The array substrate 110 supports a variety of elements of the OLED device 100 and is made of an insulative material. The array substrate 110 may be made of a transparent, insulative material such as glass, plastic, etc.

The organic light-emitting element is disposed on the array substrate 110. The organic light-emitting element includes an anode, an organic emission layer formed on the anode, and a cathode formed on the organic emission layer. The organic emission layer may be made up of a single emission layer emitting light of a color or may be made up of a plurality of emission layers to emit white light. The organic light-emitting element may be formed in the center of the array substrate 110 such that it is located in the active area A/A. In the case that the organic emission layer of the organic light-emitting element emits white light, color filters may be further disposed.

The passivation layer may cover the organic light-emitting element. The passivation layer protects the organic light-emitting element from moisture or oxygen. A face seal may be used on the passivation layer. Examples of the face seal include a face seal adhesive film. The face seal adhesive film seals the organic light-emitting element disposed on the array substrate 110 and attaches the array substrate 110 to an upper substrate (encapsulation plate).

Figure 2:
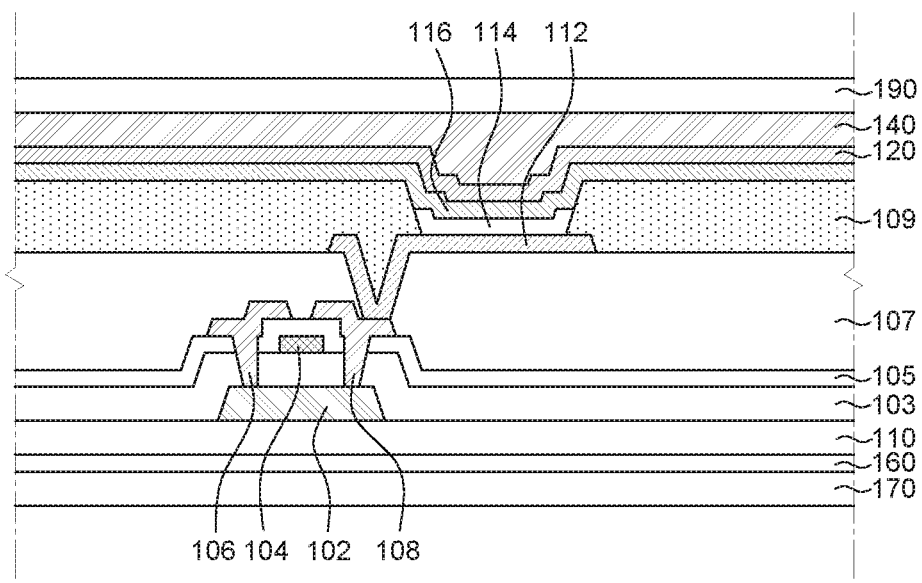
FIG. 2 is a cross-sectional view of a part of an active area of an OLED device according to an exemplary embodiment of the present disclosure.

FIG. 2 is a cross-sectional view of a part of the active area of the OLED device according to an exemplary embodiment of the present disclosure.

FIG. 2 shows a TFT including elements 102, 103, 104, 106, and 108 disposed on the array substrate 110, an organic light-emitting element including elements 112, 114 and 116, and a variety of functional layers.

The array substrate 110 may be a glass or plastic substrate. Such a plastic substrate may be made of polyimide-based material or polycarbonate-based material and thus may have flexibility.

The TFT may be formed by sequentially stacking a semiconductor layer 102 on the array substrate 110, a gate insulation film 103, a gate electrode 104, an interlayer insulation film 105, and a source electrode 106 and a drain electrode 108.

The semiconductor layer 102 may be made of a polysilicon (p-Si) and may be partially doped with impurities. In addition, the semiconductor layer 102 may be made of amorphous silicon (a-Si) or may be made of a variety of organic semiconductor material such as pentacene. Further, the semiconductor layer 102 may be made of oxide semiconductor material.

The gate insulation film 103 may be formed of an insulative inorganic material such as silicon oxide ($SiO_x$) and silicon nitride ($SiN_x$) or may be made of an insulative organic material. The gate electrode 104 may be made of a variety of conductive materials such as magnesium (Mg), aluminum (Al), nickel (Ni), chrome (Cr), molybdenum (Mo), tungsten (W), gold (Au) or an alloy thereof.

The interlayer insulation film 105 may be formed of an insulative material such as silicon oxide ($SiO_x$) and silicon nitride ($SiN_x$) or may be made of an insulative organic material. By selectively removing the interlayer insulation film 105 and the gate insulation film 103, contact holes may be formed via which a source region and a drain region are exposed.

The source electrode 106 and the drain electrode 108 are made of the same material as that of the gate electrode 104 and consist of a single layer or a plurality of layers on the interlayer insulation film 105 such that the contact holes are filled.

A planarization layer 107 may be disposed on the TFT. The planarization layer 107 protects the TFT and provides a flat surface. The planarization layer 107 may have a variety of forms. For example, the planarization layer 107 may be made of an organic insulation film such as BCB (benzocyclobutene) and acryl or may be made of an inorganic insulation film such as a silicon nitride ($SiN_x$) film and a silicon oxide ($SiO_x$) film. In addition, the planarization layer 107 may be made up of a single layer, a double layer, or a multi-layer.

The organic light-emitting element may be formed by stacking a first electrode 112, an organic emission layer 114, and a second electrode 116 in this order. That is, the organic light-emitting element may include the first electrode 112 formed on the planarization layer 107, the organic emission layer 114 disposed on the first electrode 112, and the second electrode 116 disposed on the organic emission layer 114.

The first electrode 112 is electrically connected to the drain electrode 108 of the driving TFT via the contact hole. If the OLED device 100 is of top-emission type, the first electrode 112 may be made of an opaque conductive material having high reflectivity. For example, the first electrode 112 may be made of silver (Ag), aluminum (Al), gold (Au), molybdenum (Mo), tungsten (W), chrome (Cr) or an alloy thereof.

A bank 109 (or other structures with similar functions) is formed in the rest of the area other than an emission area. Accordingly, the bank 109 has a bank hole via which the first electrode 112 in the emission area is exposed. The bank 109 may be made of an inorganic insulative material such as a silicon nitride ($SiN_x$) film and a silicon oxide ($SiO_x$) film or an organic insulative material such as BCB, acryl-based resin or imide-based resin.

The organic emission layer 114 is disposed on the first electrode 112 exposed via the hole of the bank 109. The organic emission layer 114 may include an emission layer, an electron injection layer, an electron transport layer, a hole transport layer, a hole injection layer, etc. Such layers may be independent and discrete, or some functionality may be combined together as a single layer.

The second electrode 116 is disposed on the organic emission layer 114. In the case, if the OLED device 100 is of a top-emission type, the second electrode 116 is made of a transparent, conductive material such as indium tin oxide (ITO) or indium zinc oxide (IZO), such that light generated in the organic emission layer 114 exits upward through the second electrode 116.

The passivation layer 120 is disposed on the second electrode 116. The passivation layer 120 may be configured as an inorganic film made of glass, metal, aluminum oxide ($AlO_x$) or silicon (Si)-based material or may be formed by stacking organic films and inorganic films alternately. The passivation layer 120 blocks oxygen and moisture from permeating to thereby suppress oxidation of luminous material and the material of the electrodes. If an organic light-emitting element is exposed to moisture or oxygen, the emission area may shrink, i.e., pixel shrinkage may take place or dark spots may appear in the emission area.

An adhesive layer 140 may be disposed on the passivation layer 120. The adhesive layer 140 seals the organic light-emitting element and attaches the array substrate 110 to an encapsulation plate 190.

The encapsulation plate 190 faces the array substrate 110. The lower surface of the encapsulation plate 190 comes in contact with the adhesive layer 140. The encapsulation plate 190 may be made of a material such as glass, polymer, metal, etc. The material of the encapsulation plate 190 may be determined based on the direction in which the OLED device 100 emits light, i.e. the direction of top emission, bottom emission, or dual-sided emission.

The adhesive layer 140 is disposed between the pixel drive circuit and organic light-emitting element TFT/OLED and the encapsulation plate 190 thereon. Typically, the adhesive layer 140 is attached on the encapsulation plate 190, and then the encapsulation plate 190 is attached to the array substrate 110 with the adhesive layer 140 facing the pixel drive circuit and organic light-emitting element TFT/OLED.

A lower adhesive layer 160 and a lower encapsulation layer 170 are formed under the array substrate 110 in this order. The lower encapsulation layer 170 may be made of at least one organic material selected from the group consisting of: polyethylene naphthalate (PEN), polyethylene terephthalate (PET), polyethylene ether phthalate, polycarbonate, polyarylate, polyether imide, polyether sulfonate, polyimide, and polyacrylate. The lower encapsulation layer 170 may suppress moisture or oxygen from permeating into the substrate 110.

The lower adhesive layer 160 is made of thermosetting adhesive or a naturally-curable adhesive and attaches the array substrate 110 to the lower encapsulation layer 170. For example, the lower adhesive layer 160 may be made of an optically clear adhesive (OCA).

Figure 3:
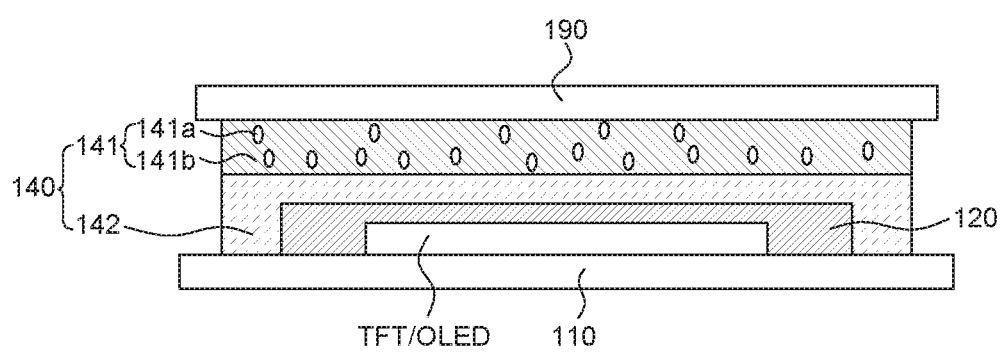
FIG. 3 is a view showing an encapsulation structure of an OLED device according to an exemplary embodiment of the present disclosure.

FIG. 3 is a cross-sectional view showing an encapsulation structure of an OLED device according to an exemplary embodiment of the present disclosure.

The OLED device 100 may include an array substrate 110, a pixel drive circuit and organic light-emitting element TFT/OLED, a passivation layer 120, an adhesive layer 140, and an encapsulation plate 190.

The array substrate 110 is made of an insulative material and supports a variety of elements of the OLED device 100.

The pixel drive circuit and organic light-emitting element TFT/OLED is disposed on the array substrate 110. The organic light-emitting element includes an anode, an organic emission layer formed on the anode, and a cathode formed on the organic emission layer. The organic emission layer may be made up of a single emission layer emitting light of a color or may be made up of a plurality of emission layers to emit white light. The organic light-emitting element may be formed on the array substrate 110 such that it is located in the active area. A pixel drive circuit for driving the organic light-emitting element, i.e., a variety of elements such as TFTs, capacitors, etc., and lines may be disposed in association with the organic light-emitting element. The structure and function of the pixel drive circuit and the organic light-emitting element are substantially identical to those described above with reference to FIG. 2.

The OLED device 100 includes an encapsulation structure for covering the organic light-emitting element to block permeation of moisture or oxygen. The encapsulation structure may be a face seal structure including a passivation layer, an adhesive layer and an encapsulation plate.

The passivation layer 120 is a functional layer for protecting the pixel drive circuit and organic light-emitting element TFT/OLED, and covers the pixel drive circuit and organic light-emitting element TFT/OLED to block the permeation of moisture or oxygen. The passivation layer 120 may be an inorganic film or may be formed by stacking organic films and inorganic films alternately. For example, the passivation layer 120 may be an inorganic thin film based on an organosilicon compound. The passivation layer 120 is advantageous over a passivation layer made based on silane ($SiH_4$) or ammonia ($NH_3$), in that a shift in the threshold voltage of the oxide TFT is reduced. More detailed description thereon will be made with reference to FIG. 4.

The adhesive layer 140 seals the organic light-emitting element and attaches the array substrate 110 to the encapsulation plate 190. The adhesive layer 140 may be made of a mixture of a curable resin and a functional additive. For example, the adhesive layer 140 may be made of a curable resin and a getter and/or filler dispersed in the curable resin. The curable resin may be made of, but is not limited to, an epoxy-based polymer, an olefin-based polymer, etc.

The adhesive layer 140 may be a face seal adhesive having a multi-layer structure in which multiple layers are stacked one on another vertically. For example, the adhesive layer 140 may be a face seal adhesive including a first layer 141 (a first adhesive layer) and a second layer 142 (a second adhesive layer).

The first layer 141 may also be referred to as a barrier layer (B-layer) and may be attached to a surface of the encapsulation plate 190 facing the array substrate 110. The first layer 141 may be made of curable resin 141b containing moisture adsorbent 141a. The moisture adsorbent 141a of the first layer 141 act to adsorb or remove moisture or oxygen by physical or chemical reaction, etc. For example, the moisture adsorbent 141a may be a reactive adsorbent such as metal powder including alumina, a metal oxide, a metal salt, phosphorous pentoxide ($P_2O_5$) or a mixture thereof. As another example, the moisture adsorbent 141a may be a physical adsorbent such as silica, zeolite, titania, zirconia, montmorillonite, etc.

The metal oxide may be lithium oxide ($Li_2O$), sodium oxide ($Na_2O$), barium oxide (BaO), calcium oxide (CaO) or magnesium oxide (MgO). The metal salt may be a sulfate such as lithium sulfate ($Li_2SO_4$), sodium sulfate ($Na_2SO_4$), calcium sulfate ($Ca_5O_4$), magnesium sulfate ($Mg_5O_4$), cobalt sulfate ($CoSO_4$), gallium sulfate ($Ga_2(SO_4)_3$), titanium sulfate ($Ti(SO_4)_2$), or nickel sulfate ($NiSO_4$). In addition, the metal salt may be a metal halide such as calcium chloride ($CaCl_2$), magnesium chloride ($MgCl_2$), strontium chloride ($SrCl_2$), chloride, yttrium ($YCl_3$), copper chloride ($CuCl_2$), cesium fluoride (CsF), fluoride tantalum ($TaF_5$), fluoride, niobium ($NbF_5$), lithium bromide (LiBr), calcium bromide ($CaBr_2$), cesium bromide ($CeBr_3$), selenium bromide ($SeBr_4$), vanadium bromide ($VBr_3$), magnesium bromide ($MgBr_2$), barium iodide ($BaI_2$) or magnesium iodide ($MgI_2$), or a metal chlorate such as barium perchlorate ($Ba(ClO_4)_2$), magnesium perchlorate ($Mg(ClO_4)_2$). It is to be noted that the moisture adsorbent 141a is not limited to those listed above.

The second layer 142 may also be referred to as a transparent layer (T-layer). The second layer 142 is made of a transparent curable resin. The second adhesive layer 142 may be a thermosetting resin or a photo-curable resin. The curable resin of the second layer 142 may be the same as or different from the curable resin 141b of the first layer 141. For example, the curable resin 141b may be a thermosetting resin that includes at least one heat-curable functional group such as glycidyl group, isocyanate group, hydroxyl group, carboxyl group, amide group or the like.

A face of the second layer 142 comes in contact with the array substrate 110 and the organic light-emitting element (or an insulation film thereon) and may mitigate a pressure exerted when the array substrate 110 is attached to the encapsulation plate 190. The other face of the second layer 142 comes in contact with a face of the first layer 141.

The encapsulation plate 190 faces the array substrate 110. The lower surface of the encapsulation plate 190 comes in contact with the adhesive layer 140. The encapsulation plate 190 may be made of a material such as glass, polymer, metal, etc. The material of the encapsulation plate 190 may be determined based on the direction in which the OLED device 100 emits light.

Referring to FIG. 3, the adhesive layer 140 is disposed between the pixel drive circuit and organic light-emitting element TFT/OLED and the encapsulation plate 190 thereon. Typically, the adhesive layer 140 is attached on the encapsulation plate 190, and then the encapsulation plate 190 is attached to the array substrate 110 with the adhesive layer 140 facing the pixel drive circuit and organic light-emitting element TFT/OLED.

FIG. 4 shows a process of forming a passivation layer according to an exemplary embodiment of the present disclosure.

The passivation layer 120 is a functional layer for protecting the pixel drive circuit and organic light-emitting element TFT/OLED, and covers the pixel drive circuit and organic light-emitting element TFT/OLED to block the permeation of moisture or oxygen. For example, the passivation layer 120 may be an inorganic thin film based on an organosilicon compound. The passivation layer 120 is advantageous over a passivation layer made based on silane ($SiH_4$) or ammonia ($NH_3$), in that a shift in the threshold voltage of the oxide thin-film transistor (oxide TFT) is reduced.

The passivation layer 120 may be formed by depositing a silicon nitride ($SiN_x$)-based or silicon oxide ($SiO_x$)-based compound on the pixel drive circuit and organic light-emitting element TFT/OLED using a plasma enhanced chemical vapor deposition (PECVD) technique, or by depositing an aluminum oxide ($AlO_x$)-based compound using sputtering. Typically, silane ($SiH_4$) gas and ammonia ($NH_3$) gas are used in the PECVD process to form the $SiN_x$-based or $SiO_x$-based film.

For an OLED device, the PECVD process is carried out at a temperature lower than 100° C. in order to avoid deterioration of the OLED device. During the PECVD process, chemical reactions may proceed incompletely, such that hydrogen atoms (H) contained in the $SiH_4$ and $NH_3$ based gas may remain on the passivation layer 120. The hydrogen atoms remaining on the passivation layer 120 are diffused even to the pixel drive circuit over time. The diffused hydrogen atoms reduce the oxide semiconductor layer (a channel layer) of the TFT included in the pixel drive circuit, thereby deteriorating the performance of the TFT. For example, the diffused hydrogen atoms may shift the threshold voltage Vth of the oxide TFT, thereby causing screen spots or uneven brightness.

In order to solve such problems recognized by the present inventors, according to an exemplary embodiment of the present disclosure, there is provided a passivation layer 120 suppressing the diffused hydrogen issue and a method for producing it. According to an exemplary embodiment of the present disclosure, there is provided a structure of a passivation layer 120 that reduces Si—$CH_3$ bonds by using a reaction by which an organosilicon compound is polymerized by oxygen ($O_2$), ozone ($O_3$), or di-nitrogen monoxide ($N_2O$) plasma. Typically, hydrogen atoms contained in the Si—$CH_3$ bonds have weak bonding force since they react at a low temperature, and thus they are diffused over time, such that the above-mentioned issue takes place. Accordingly, by reducing the number (amount) of Si—$CH_3$ bonds by the polymerization method described herein, the issues or problems associated with the diffused hydrogen atoms can be effectively suppressed.

Figure 4A:
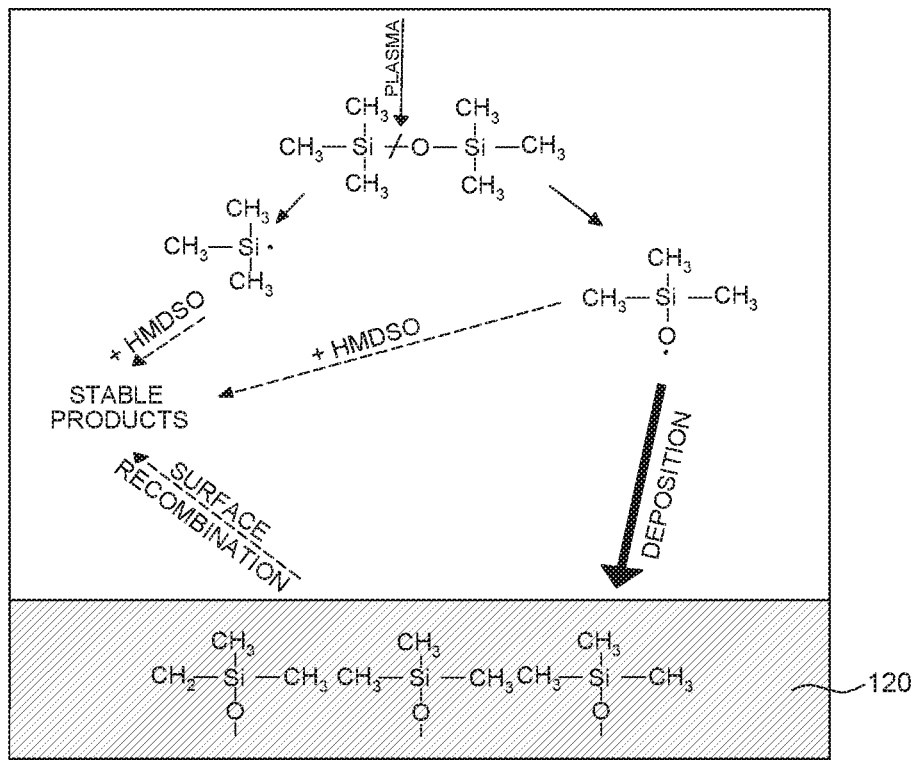
FIGS. 4A and 4B illustrates a process of producing a passivation layer of an OLED device according to an exemplary embodiment of the present disclosure.
Figure 4B:
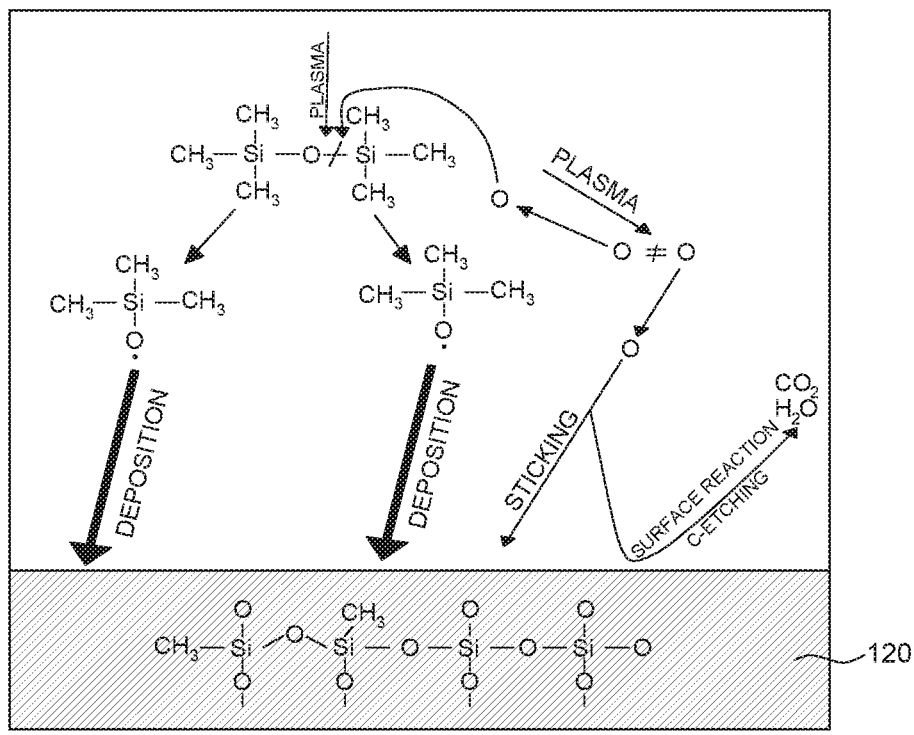

The organosilicon compound may be, for example, HMDSN (hexamethyldisilazane: $C_6H_{19}NSi_2$) or HMDSO (hexamethyldisiloxane: $C_6H_{18}OSi_2$). FIG. 4 illustrates a process of producing a passivation layer 120 with HMDSO. FIG. 4A illustrates a process of depositing HMDSO in plasma phase. FIG. 4B illustrates a process in which oxygen in plasma phase reacts with HMDSP in plasma phase. In the reaction shown in FIG. 4, inert gas such as argon (Ar) may be introduced to facilitate the reaction.

In the process shown in FIG. 4A, after the Si—O bond of the HMDSO is dissociated, a part thereof is deposited as $SiO(CH_3)_3$, forming the passivation layer 120. In the process shown in FIG. 4B, on the other hand, after the Si—O bond of the HMDSO is dissociated, a methyl group ($CH_3$) is substituted with an oxygen atom (O), forming the passivation layer 120. As a result, the carbon atom (C) and hydrogen atom (H) content in the passivation layer 120 becomes extremely small. That is, in the process shown in FIG. 4B, the passivation layer 120 is produced by the oxidation reaction between the organosilicon compound and oxygen (or e.g., dinitrogen monoxide, ozone).

In the passivation layer 120 produced according to the process shown in FIG. 4A, the hydrogen atoms contained in the Si—$CH_3$ bonds are diffused over time. The hydrogen atoms cause the above-mentioned issue, i.e., undesired shift of TFT characteristics. In contrast, in the passivation layer 120 produced according to the process shown in FIG. 4B, there exists an extremely small number of Si—$CH_3$ bonds, and thus the issue caused by diffused hydrogen atoms can be suppressed.

That is, a smaller number of Si—$CH_3$ bonds are in the passivation layer 120 results in better performance of the display device. The passivation layer 120 according to the exemplary embodiment of the present disclosure is especially advantageous for an OLED device employing oxide TFTs, since a pixel drive circuit including a TFT having an oxide semiconductor layer is more affected by diffusion of hydrogen.

For example, the amount of the Si—$CH_3$ bonds is much smaller than the amount of the Si—O bonds, such as, 1/1000 of the amount of Si—O bonds or less. In order to quantitatively measure the amounts of a variety of bonds in a compound, Fourier-Transform infrared spectroscopy (FT-IR) may be used. The FT-IR is a type of infrared spectroscopy that uses white light in infrared range whose phase has been modulated by an interferometer. Specifically, infrared ray is irradiated onto a sample, and an energy absorption corresponding to the vibration and rotation of a molecule under dipole moment change is measured. In a molecule, atoms are vibrating or rotating. By such movement, the molecule absorbs light of a specific wavelength in the infrared range. The wavelength of the absorbed light is determined by the bonding between atoms in a molecule, almost irrespectively of the size of the molecule or the structure of other portions. Accordingly, by analyzing the energy absorption, information on the type of bonding between atoms, a functional group of the molecule, etc., can be obtained.

Figure 5A:
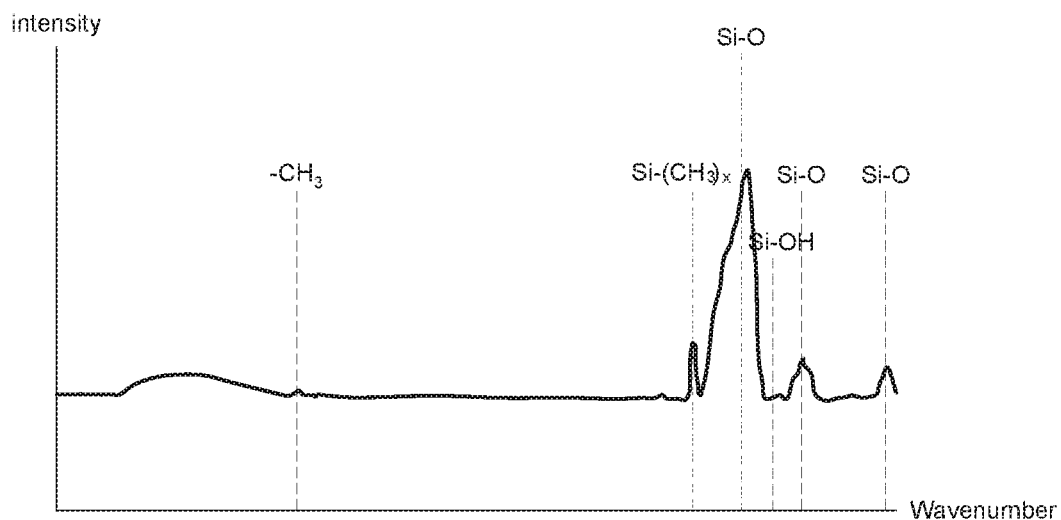
FIGS. 5A and 5B are graphs showing characteristics of an OLED device according to an exemplary embodiment of the present disclosure.
Figure 5B:
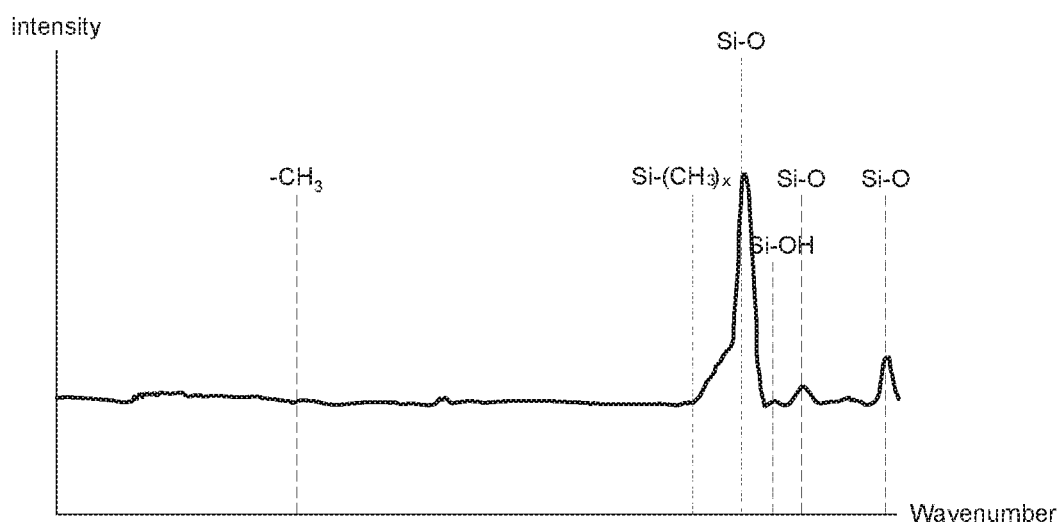

FIG. 5 is a graph showing results of analyzing the passivation layers produced by the processes shown in FIG. 4, respectively, using FT-IR. FIG. 5A is a graph showing results of analyzing the passivation layer produced by the process shown in FIG. 4A. FIG. 5B is a graph showing results of analyzing the passivation layer produced by the process shown in FIG. 4B. On the graphs, a particular bonding reaction to a specific wavelength is shown as a peak. It can be seen that a peak appears at a wavelength corresponding to Si—$CH_3$ bonds in FIG. 5A, but not in FIG. 5B. That is, it can be concluded that there are minimal Si—$CH_3$ bonds in the passivation layer produced by the process of the present embodiments as shown in FIG. 4B.

In order to quantitatively measure a particular bonding by FT-IR analysis, an interval on the graph shown in FIG. 5A or FIG. 5B corresponding to the bonding is integrated, and the value may be expressed as the intensity of the bonding. In FIG. 5A, a ratio of intensity between Si—$CH_3$ bonds and Si—O bonds is approximately 4/1,000. In FIG. 5B, a ratio of intensity between Si—$CH_3$ bonds and Si—O bonds is approximately zero. In addition, the reliability of samples with the characteristics shown in FIGS. 5A and 5B was tested, and the results are shown in Table 1. As can be seen from Table 1, the sample with the characteristics shown in FIG. 5A had strong bright spots viewable on a display screen, but the sample with the characteristics shown in FIG. 5B did not.

TABLE 1

|  |  | 5A | 5B |
|---|---|---|---|
| Strong Bright Spot | Occurrence | Occurred@300 hrs | Not occurred@850 hrs |
|  | Number of Panels (Occurrence/Total Number) | 4/4 | 0/11 |
| FT-IR (Si—$CH_3$/$SiO_x$ * 10,000) |  | 41 | 0 |

After repeating such tests, the present inventors have found out that no bright spots appeared when the ratio between Si—$CH_3$ bonds and Si—O bonds is approximately 1/1,000 or less.

In order to reduce such undesired Si—$CH_3$ bonds, the present inventors recognized that a ratio between reaction gases (HMDSO and $O_2$/$N_2O$), a processing temperature, a processing pressure, energy required to ionize reaction gas into plasma (RF power or the like), etc., have to be considered.

According to exemplary embodiments of the present disclosure, an organosilicon compound is used in the process of depositing a passivation layer, and the organosilicon compound reacts with oxygen ($O_2$), ozone ($O_3$), or dinitrogen monoxide ($N_2O$) in plasma phase, thereby fabricating a display device with improved reliability, over a passivation layer produced based on $SiH_4$ or $NH_3$. As a result, a display device with reduced shift in the threshold voltage Vth of an oxide TFT can be obtained.

The exemplary embodiments of the present disclosure can also be described as follows.

According to an aspect of the present disclosure, there is provided an OLED device. The OLED device includes a pixel drive circuit and an organic light-emitting element on an array substrate, a passivation layer covering the pixel drive circuit and organic light-emitting element so as to block permeation of moisture, and an adhesive layer on the passivation layer. The passivation layer is an inorganic thin film based on an organosilicon compound.

The passivation layer may be produced by an oxidation reaction between the organosilicon compound and oxygen.

The passivation layer may be produced as the organosilicon compound in plasma phase reacts with oxygen ($O_2$), dinitrogen monoxide ($N_2O$) or ozone ($O_3$) in plasma phase.

The organosilicon compound may be HMDSO (hexamethyldisiloxane) or HMDSN (hexamethyldisilazane).

The passivation layer may be deposited by $CH_3$ bonded to Si which is substituted with O.

The passivation layer may include an amount of Si—$CH_3$ bonds that is less than 1/1000 of the amount of the Si—O bonds.

The pixel drive circuit may include a TFT having an oxide semiconductor layer.

A shift in a threshold voltage of the TFT may be reduced compared with the passivation layer produced based on silane ($SiH_4$) or ammonia ($NH_3$).

The adhesive layer may include a first adhesive layer formed of a resin having moisture absorbents, and a second adhesive layer formed of a transparent resin.

The first adhesive layer may be attached to an second adhesive layer and an encapsulation plate facing the array substrate, and the second adhesive layer may be attached to the passivation layer and to a part of the array substrate around the passivation layer.

The encapsulation plate may be made of glass, polymer or metal.

Thus far, exemplary embodiments of the present disclosure have been described in detail with reference to the accompanying drawings. However, the present disclosure is not limited to the exemplary embodiments, and modifications and variations can be made thereto without departing from the technical idea of the present disclosure. Accordingly, the exemplary embodiments described herein are merely illustrative and are not intended to limit the scope of the present disclosure. The technical idea of the present disclosure is not limited by the exemplary embodiments. Therefore, it should be understood that the above-described embodiments are not limiting but illustrative in all aspects. The scope of protection sought by the present disclosure is defined solely by the appended claims and all equivalents thereof are construed to be within the true scope of the present disclosure.

What is claimed is:

1. An organic light-emitting display (OLED) device, comprising:
a pixel drive circuit and an organic light-emitting element on an array substrate;
a passivation layer comprising an inorganic thin film including an organosilicon compound, the passivation layer covering the pixel drive circuit and the organic light-emitting element to block permeation of moisture, wherein an amount of Si—$CH_3$ bonds in the passivation layer is less than 1/1000 of an amount of Si—O bonds in the passivation layer; and
an adhesive layer on the passivation layer.

2. The OLED device of claim 1, wherein the passivation layer is produced by an oxidation reaction between the organosilicon compound and oxygen.

3. The OLED device of claim 2, wherein the passivation layer is produced by reacting the organosilicon compound in plasma phase with oxygen ($O_2$), di-nitrogen monoxide ($N_2O$), or ozone ($O_3$) in plasma phase.

4. The OLED device of claim 2, wherein the organosilicon compound is HMDSO (hexamethyldisiloxane) or HMDSN (Hexamethyldisilazane).

5. The OLED device of claim 4, wherein the passivation layer is deposited by substituting a methyl group (—$CH_3$) bonded to Si with an oxygen atom (O) in the HMDSO or HMDSN.

6. The OLED device of claim 1, wherein the pixel drive circuit comprises a thin-film transistor (TFT) having an oxide semiconductor layer.

7. The OLED device of claim 6, wherein a shift in a threshold voltage of the TFT is reduced compared with another TFT covered with a passivation layer produced based on silane ($SiH_4$) or ammonia ($NH_3$).

8. The OLED device of claim 1, wherein the adhesive layer comprises a first adhesive layer formed of a resin having moisture absorbent material, and a second adhesive layer formed of a transparent resin.

9. The OLED device of claim 8, wherein the first adhesive layer is attached to the second adhesive layer and an encapsulation plate facing the array substrate, and the second adhesive layer is attached to the passivation layer and to a part of the array substrate around the passivation layer.

10. The OLED device of claim 9, wherein the encapsulation plate is made of glass, polymer, or metal.

11. An encapsulation structure for an organic light-emitting display (OLED) device, comprising:
a passivation layer covering an organic light-emitting element to block permeation of moisture, wherein the passivation layer is an inorganic film including an organosilicon compound, wherein an amount of Si—$CH_3$ bonds in the passivation layer is less than 1/1000 of an amount of Si—O bonds in the passivation layer;
an encapsulation plate configured to block permeation of moisture; and
an adhesive layer between the encapsulation plate and the passivation layer.

12. The encapsulation structure of claim 11, wherein the passivation layer is deposited by substituting a methyl group (—$CH_3$) bonded to Si with an oxygen atom (O) in the organosilicon compound.

13. The encapsulation structure of claim 12, wherein the passivation layer is configured to reduce shifts in a threshold voltage of a thin-film transistor (TFT) due to diffused hydrogen atoms.

14. The encapsulation structure of claim 13, wherein the passivation layer is produced by reacting the organosilicon compound in plasma phase with oxygen ($O_2$), di-nitrogen monoxide ($N_2O$), or ozone ($O_3$) in plasma phase.

15. The encapsulation structure of claim 11, wherein the adhesive layer is a face seal adhesive having a multi-layer structure in which multiple layers are stacked one on another.

16. The encapsulation structure of claim 15, wherein the adhesive layer comprises a curable resin and a moisture adsorbent material dispersed in the curable resin.

17. The encapsulation structure of claim 11, wherein the encapsulation plate is made of glass, polymer, or metal.

18. The encapsulation structure of claim 11, wherein the encapsulation structure is part of a face seal.

* * * * *